United States Patent
Rajagopal et al.

(10) Patent No.: US 8,793,399 B1
(45) Date of Patent: Jul. 29, 2014

(54) METHOD AND SYSTEM FOR ACCELERATING NETWORK PACKET PROCESSING

(75) Inventors: Murali Rajagopal, Irvine, CA (US); Jerald K. Alston, Coto de Caza, CA (US); Sanjaya Anand, Coto de Caza, CA (US); Bruce A. Klemin, Rocklin, CA (US)

(73) Assignee: QLOGIC, Corporation, Aliso Viejo, CA (US)

( * ) Notice: Subject to any disclaimer, the term of this patent is extended or adjusted under 35 U.S.C. 154(b) by 681 days.

(21) Appl. No.: 12/536,336

(22) Filed: Aug. 5, 2009

Related U.S. Application Data

(60) Provisional application No. 61/086,636, filed on Aug. 6, 2008.

(51) Int. Cl.
| | | |
|---|---|---|
| *G06F 15/16* | (2006.01) | |
| *G06F 15/173* | (2006.01) | |
| *G06F 7/00* | (2006.01) | |
| *H04L 29/06* | (2006.01) | |
| *G06F 11/10* | (2006.01) | |
| *H04L 29/12* | (2006.01) | |
| *H04L 1/00* | (2006.01) | |
| *H03M 13/09* | (2006.01) | |
| *H04L 12/56* | (2006.01) | |
| *G06F 13/42* | (2006.01) | |

(52) U.S. Cl.
CPC .............. *H04L 69/22* (2013.01); *G06F 11/1004* (2013.01); *H04L 61/6031* (2013.01); *H04L 1/004* (2013.01); *H03M 13/09* (2013.01); *H04L 29/0653* (2013.01); *H04L 49/3009* (2013.01); *G06F 13/4221* (2013.01)

USPC ............ 709/246; 709/223; 707/699; 719/326

(58) Field of Classification Search
CPC . G06F 11/1004; G06F 13/4221; H04L 1/004; H04L 29/0653; H04L 49/3009; H04L 61/6031; H04L 69/22; H03M 13/09
USPC .................. 709/223, 227, 232, 246; 719/326; 707/699
See application file for complete search history.

(56) References Cited

U.S. PATENT DOCUMENTS

| | | | |
|---|---|---|---|
| 2003/0058870 A1* | 3/2003 | Mizrachi et al. | 370/395.52 |
| 2005/0281286 A1* | 12/2005 | Wang et al. | 370/469 |
| 2006/0056435 A1* | 3/2006 | Biran et al. | 370/412 |
| 2006/0114909 A1* | 6/2006 | Uzrad-Nali et al. | 370/394 |
| 2006/0271639 A1* | 11/2006 | Kumagai et al. | 709/217 |
| 2007/0022226 A1* | 1/2007 | Wu et al. | 710/22 |
| 2007/0147390 A1* | 6/2007 | Jung et al. | 370/395.52 |
| 2008/0008205 A1* | 1/2008 | Jung et al. | 370/419 |
| 2009/0183057 A1* | 7/2009 | Aizman | 714/807 |

* cited by examiner

*Primary Examiner* — Brain J Gillis
(74) *Attorney, Agent, or Firm* — Klein, O'Neill & Singh, LLP

(57) ABSTRACT

Method and System for processing network information is provided. The system includes a computing system having a processor for executing instructions for an application module that generates an input/output ("I/O") request for transmitting and receiving network information to and from the network device; a storage driver for receiving the I/O request from the application module; a network protocol stack for executing a network protocol layer for processing network related information; and an accelerator module that interfaces with the storage driver and the network protocol stack for accelerating processing of Internet Small Computer System Interface (iSCSI) protocol data units (PDUs).

19 Claims, 6 Drawing Sheets

METHOD AND SYSTEM FOR ACCELERATING NETWORK PACKET PROCESSING

CROSS REFERENCE TO RELATED APPLICATIONS

This parent application claims priority to U.S. Provisional Patent Application Ser. No. 61/086,636, filed on Aug. 6, 2008, the disclosure of which is incorporated herein by reference in its entirety.

BACKGROUND

The present disclosure relates to networks and storage systems.

Computer networks are commonly used today in various applications. Computer networks typically use a layered protocol structure to manage network and storage traffic. One common model that is typically used includes a physical layer, a data link layer that includes a media access (MAC) layer, a network layer and others. Upper level protocol layers (ULPs) interface with a network layer to send and receive data from the network. Continuous efforts are being made to efficiently move network and storage information.

SUMMARY

In one embodiment, a system for processing network information is provided. The system includes a computing system operationally coupled to a network device for transmitting and receiving network information. The computing system includes a processor that executes instructions for an application module that generates an input/output ("I/O") request for transmitting and receiving network information to and from the network device; a storage driver for receiving the I/O request from the application module; a network protocol stack for executing a network protocol layer for processing network related information; and an accelerator module that interfaces with the storage driver and the network protocol stack for accelerating processing of Internet Small Computer System Interface (iSCSI) protocol data units (PDUs).

The system also includes an adapter operationally coupled to the computing system and configured to assist the accelerator module for processing the iSCSI PDUs that are received and transmitted by the adapter.

When an iSCSI PDU is received by the adapter, then an adapter driver executed by the processor strips network headers from the received iSCSI PDU and the network stack executed by the processor performs network protocol processing. The adapter determines cyclic redundancy code (CRC) for an header of the iSCSI PDU, uses the determined CRC to verify if CRC associated with the header of the received iSCSI PDU is valid and determines a CRC for a payload of the received iSCSI PDU.

When an iSCSI PDU is transmitted by the adapter, then the accelerator module builds an iSCSI header, computes CRC for the header, attaches the computed CRC to the iSCSI header and sends the iSCSI PDU to the adapter that computes CRC for a payload of the iSCSI PDU, before transmitting the iSCSI PDU.

In another embodiment, a system for processing network information is provided. The system includes a computing system operationally coupled to a network device. The computing system includes a processor executing instructions for an application module that generates an input/output ("I/O") request for receiving network information from a network device; a storage driver for receiving the I/O request from the application module; a network protocol stack for executing a network protocol layer for processing network related information; and an accelerator module that interfaces with the storage driver and the network protocol stack for accelerating processing of a received Internet Small Computer System Interface (iSCSI) protocol data unit (PDU).

The system also includes an adapter operationally coupled to the computing system and configured to assist the accelerator module for processing the iSCSI PDU received by the adapter. When the iSCSI PDU is received, an adapter driver executed by the processor strips network headers from the received iSCSI PDU and the network stack executed by the processor performs network protocol processing. The adapter then determines cyclic redundancy code (CRC) for a header of the iSCSI PDU, uses the determined CRC to verify if CRC associated with the iSCSI PDU is valid, notifies the accelerator module after verifying if the CRC associated with the header of the received iSCSI PDU is valid. The adapter also determines a CRC for a payload of the iSCSI PDU and notifies the accelerator module if the CRC for the payload of the received iSCSI PDU is valid.

In yet another embodiment, a system for processing network information is provided. The system includes a computing system operationally coupled to a network device. The computing system includes a processor executing instructions for an application module that generates an input/output ("I/O") request for transmitting network information to a network device; a storage driver for receiving the I/O request from the application module; a network protocol stack for executing a network protocol layer for processing network related information; and an accelerator module that interfaces with the storage driver and the network protocol stack for accelerating processing of an Internet Small Computer System Interface (iSCSI) protocol data unit (PDU).

The system also includes an adapter operationally coupled to the computing system and configured to assist the accelerator module for processing the iSCSI PDU that transmitted by the adapter. To transmit the iSCSI PDU, the accelerator module builds an iSCSI header for the iSCSI PDU, computes CRC for the header, attaches the computed CRC to the iSCSI header and sends the iSCSI PDU to the adapter. The adapter then computes CRC for a payload of the iSCSI PDU, before transmitting the iSCSI PDU.

This brief summary has been provided so that the nature of the disclosure may be understood quickly. A more complete understanding of the disclosure can be obtained by reference to the following detailed description of the various embodiments thereof concerning the attached drawings.

BRIEF DESCRIPTION OF THE DRAWINGS

The foregoing features and other features of the present disclosure will now be described with reference to the drawings of a preferred embodiment. In the drawings, the same components have the same reference numerals. The illustrated embodiment is intended to illustrate, but not to limit the disclosure. The drawings include the following Figures.

DETAILED DESCRIPTION

To facilitate an understanding of the various embodiments, a high level description of common network protocols/standards and the general architecture/operation of a network will be described. The specific architecture and operation of the various embodiments will then be described with reference to the general architecture.

Figure 1A:
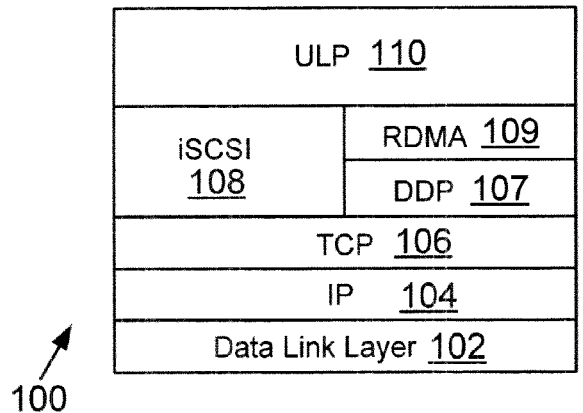
FIG. 1A shows an example of various protocol layers used in a networking and storage system.

Computing systems and devices use various protocols/standards for network communication. FIG. 1A shows an example of various protocol layers 100 that are typically used in networking systems. Layers 100 includes a data link layer (which includes the MAC layer) 102 that interfaces with an IP (Internet Protocol) layer 104. TCP (Transmission Control Protocol) layer 106 is typically located above the IP layer 104. Upper Layer Protocols (ULPs) 110 may include a plurality of layers, for example, the Internet Small Computer Systems Interface (iSCSI) layer 108, the Remote Direct Memory Access (RDMA) layer 109, Direct Data Placement (DDP) layer 107 and others. The following provides a brief introduction of some of the standards/protocol layers used for network communication:

"DDP" is a standard protocol that allows one to place data into buffers designated by protocols layered above DDP, for example, RDMA, described below. The DDP layer is typically placed below RDMA and above TCP as shown in FIG. 1A.

TCP/IP: TCP 106 is a commonly used network protocol that provides connection-oriented, reliable, byte stream service. This means that two nodes establish a logical connection before sending data and TCP maintains state information regarding the data transfer. Reliable means that data is delivered in the same order that it was sent and retransmitted if necessary. A byte stream service means that TCP views data to be sent as a continuous data stream that is sent in any way it sees fit and delivers it to the remote node as a byte stream.

The IP layer 104 is a standard protocol that provides a datagram service whose function is to enable routing of data through various network subnets. Each of these subnets could be a different physical link such as Ethernet, ATM, or others. IP is also responsible for fragmentation of the transmit data to match a local link's maximum transmission unit (MTU). The IP layer can fragment data at the source node or at any intervening router between the source and destination node.

iSCSI Protocol: iSCSI as defined by the Internet Engineering Task Force (IETF) maps the standard SCSI protocol on top of the TCP/IP protocol. iSCSI is based on the SCSI standard, which enables host computer systems to perform block data input/output ("I/O") operations with a variety of peripheral devices including disk and tape devices, optical storage devices, as well as printers and scanners. The iSCSI and TCP/IP protocol suite may include four protocol layers; the application layer (of which iSCSI is one application), the transport layer (TCP), the network layer (IP) and the link layer (for example, Ethernet).

A traditional SCSI connection between a computing system (or "host system") and peripheral device is through parallel cabling and is limited by distance and device support constraints. For storage applications, iSCSI was developed to take advantage of network architectures based on Ethernet standards. iSCSI leverages the SCSI protocol over established networked infrastructures and defines the means for enabling block storage applications over TCP.

The iSCSI architecture is based on a client/server model. Typically, the client (for example, a computing system) is an initiator that initiates a read or write command and a disk array is a target that accepts a read or write command and performs the requested operation.

In a typical iSCSI exchange, an initiator sends a "read" or "write" command to a target. For a read operation, the target sends the requested data to the initiator. For a write command, the target sends a "Ready to Transfer Protocol Data Unit ("PDU")" informing the initiator that the target is ready to accept the write data. The initiator then sends the write data to the target.

Once the data is transferred, the exchange enters the response phase. The target then sends a response PDU to the initiator with the status of the operation. Once the initiator receives this response, the exchange is complete. The use of TCP guarantees the delivery of the PDUs.

Typically, logical units in the target process commands. Commands are sent by the host system in Command Descriptor Blocks ("CDB"). A CDB is sent to a specific logical unit, for example, the CDB may include a command to read a specific number of data blocks. The target's logical unit transfers the requested data block to the initiator, terminating with a status message indicating completion of the request, iSCSI encapsulates CDB transactions between initiators and targets over TCP/IP networks.

RDMA:

RDMA 109 is a standard upper layer protocol that assists one computer to directly place information in another computer's memory with minimal demands on memory bus bandwidth and CPU processing overhead. RDMA over TCP/IP defines the interoperable protocols to support RDMA operations over standard TCP/IP networks.

iSCSI Digests:

iSCSI Data Digests are 4-byte fields appended to the end of an iSCSI PDU, which are a CRC calculation over the data portion of the PDU. iSCSI Header Digests are 4-byte fields appended to the end of a 48-byte iSCSI PDU Header, which are a CRC calculation over the header portion of the PDU.

As used in this disclosure, the terms "component" "module", "system," and the like are intended to refer to a computer-related entity, either software-executing general purpose processor, hardware, firmware and a combination thereof. For example, a component may be, but is not limited to being, a process running on a processor, a processor, an object, an executable, a thread of execution, a program, and/or a computer. By way of illustration, both an application running on a server and the server can be a component. One or more components may reside within a process and/or thread of execution, and a component may be localized on one computer and/or distributed between two or more computers. Also, these components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). Computer executable components can be stored, for example, on computer readable media including, but not limited to, an ASIC (application specific integrated circuit), CD (compact disc), DVD (digital video disk), ROM (read only memory), floppy disk, hard disk, EEPROM (electrically erasable programmable read only memory), memory stick or any other storage device, in accordance with the claimed subject matter herein.

Figure 1B:
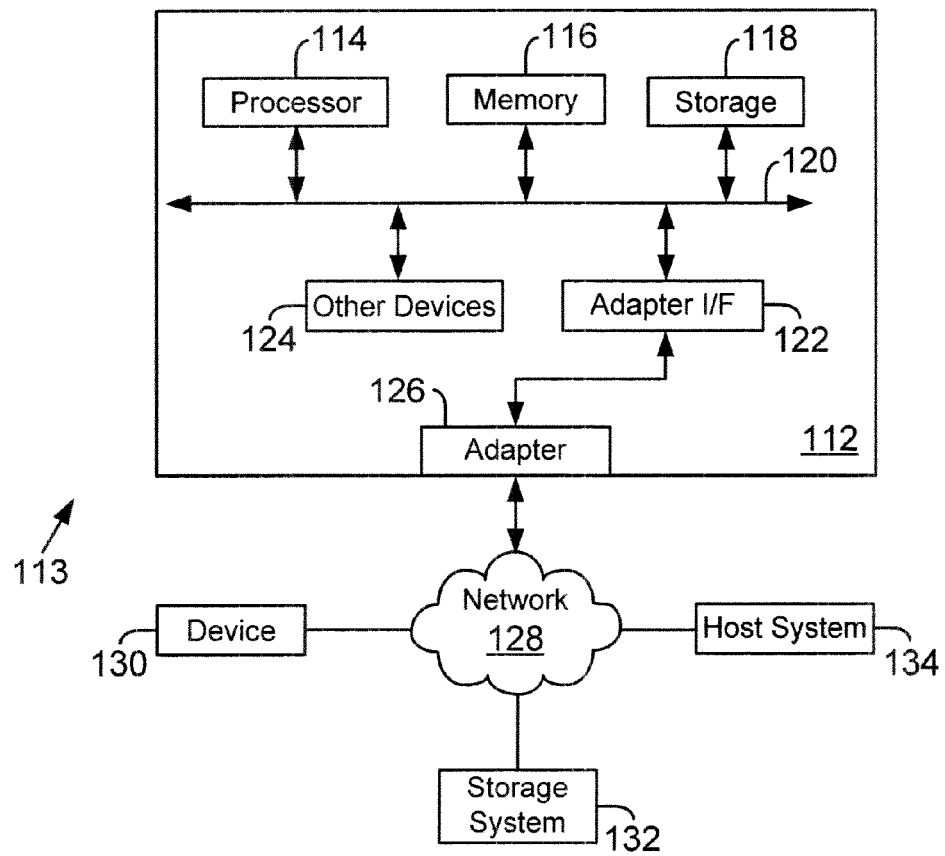
FIG. 1B shows a networking system, according to one embodiment.

Network System:

FIG. 1B shows an example of a networking system 113, used according to one embodiment. System 113 may include a computing system 112, which typically includes several functional components. These components may include a central processing unit (CPU) (also referred to as a processor or processing module) 114, a host memory (or main/system memory) 116, storage device 118, adapter interface 122, input/output ("I/O") devices (not shown), read only memory (not shown), and other components (or devices) 124.

Host memory 116 is coupled to CPU 114 via a system bus or a local memory bus 120. Host memory 116 is used to provide CPU 114 access to data and program information that is stored in host memory 116 at execution time. Typically, host memory 116 is composed of random access memory (RAM) circuits. A computing system with the CPU and main memory is often referred to as a host system.

System 113 also includes an adapter 126, which can operate both as an initiator and a target (i.e., can be used on a host bus adapter to send out input/output (I/O) commands or used with a redundant array of inexpensive disks ("RAID") controller to respond to the I/O commands). Adapter 126 may be on a PCI development board with a Field Programmable gate Array ("FPGA"). The chip may also be integrated into an Application Specific Integrated Circuit ("ASIC") with an embedded serialize/de-serializer ("SERDES") (not shown) and internal programmable random access memory ("RAM").

Adapter 126 interfaces with other devices 130 and 132 and computing system 134 via network 128. Adapter 126 can send data that is written on a networked storage device and also receive commands and data from other networked devices.

Figure 1C:
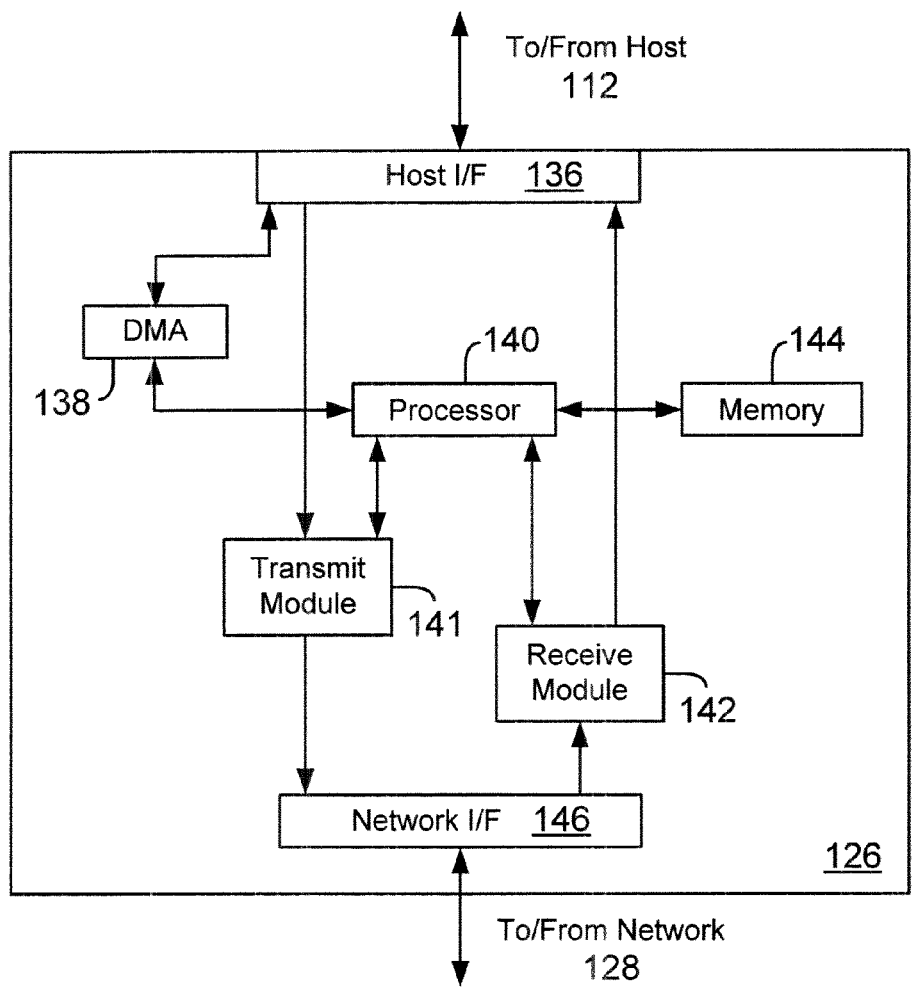
FIG. 1C shows a top-level block diagram of a network adapter interfacing with a host system, according to an embodiment.

Adapter 126:

FIG. 1C shows an example of adapter 126, as used according to one embodiment. Adapter 126 includes a plurality of modules, including a host interface 136, a DMA module 138, a processor 140, a memory 144, a receive module 142, a transmit module 141 and a network interface 146.

Processor 140 executes firmware and other instructions out of memory 144 to control overall adapter 126 operations. Processor 140 may also perform certain iSCSI and DDP layer related functionality as described below in detail.

Host interface 136 includes logic and circuitry to interface with host 112. If a peripheral bus, for example, PCI-Express is used to operationally couple adapter 126 to host 112, then host interface 136 includes all the logic and circuitry to comply with the PCI-Express bus standard.

Network interface 146 is used for interfacing with network 128. Depending on the protocol/standard, network interface 146 includes the appropriate logic and circuitry to send and receive network information. In one embodiment, network interface 146 includes an Ethernet port for sending and receiving information.

DMA engine 138 is used to perform direct memory access functions in sending data to and receiving data from the host.

Network information received from a network 128 are handled by receive module 142 and sent to host system 112. Information from host 112 is sent via transmit module 141. Both receive and transmit modules have memory storage (also referred to as buffers) for temporarily storing commands and data and logic for processing both receive and transmit side information.

Figure 2A:
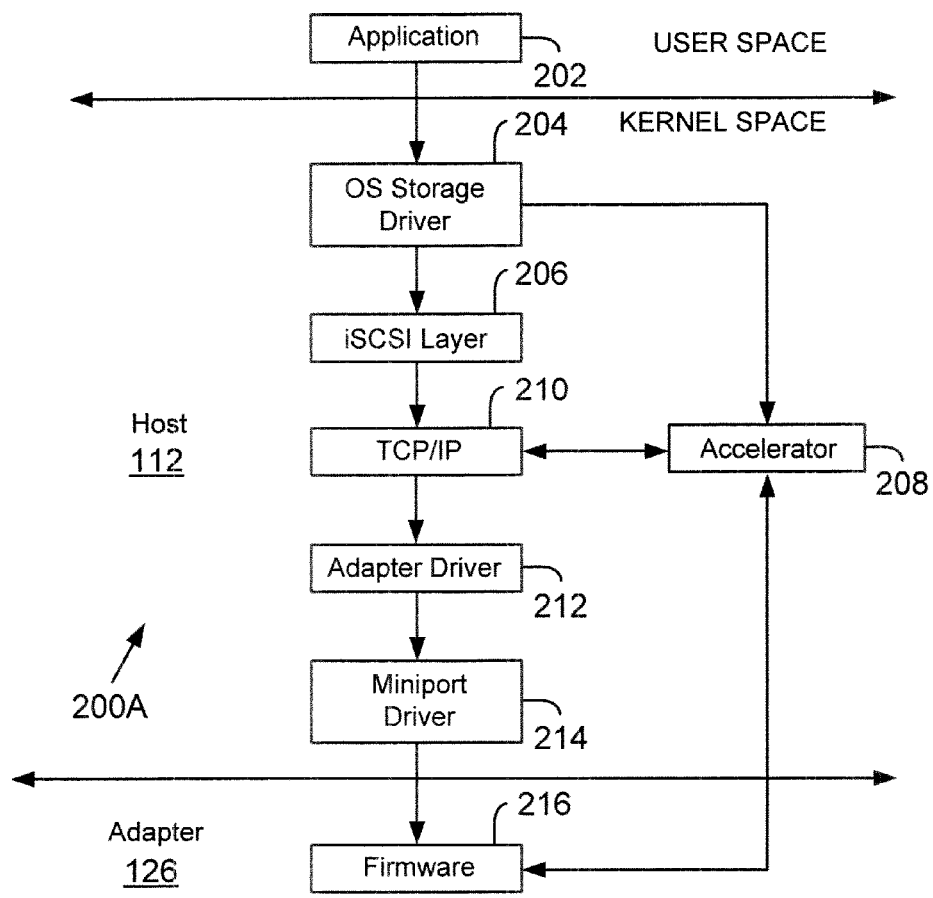
FIGS. 2A and 2B shows block diagrams of the architectures according to one embodiment.

Architecture 200A:

FIG. 2A shows a block diagram of software architecture 200A for implementing the various embodiments disclosed herein. CPU 114 executes programmable instructions for an Application layer 202 for sending (write requests) and receiving information (read request). Application layer 202 may be executed in user space and can send read and write requests to an operating system (CS) storage driver 204. An example, of one such OS driver is the Storport Driver provided by Microsoft Corporation (without diluting any trademark rights of Microsoft Corporation).

For a typical implementation, iSCSI traffic moves from OS driver 204 to iSCSI layer 206 that interfaces with the TCP/IP software stack (shown as 210). Both the iSCSI layer 206 and the TCP/IP stack 210 are typically executed by CPU 114.

TCP/IP stack 210 interfaces with an adapter driver 212 that interfaces with adapter firmware 216 via a miniport driver 214. An example of adapter driver 212 is the Network Driver Interface Specification (NDIS) driver in the Windows® operating system environment. NDIS defines a standard application program interface ("API") for network interface cards (or adapter 126). The details of a NIC's hardware implementation is wrapped by a "Media Access Controller" (MAC) device driver in such a way that all NIC's for the same media (e.g., Ethernet) can be accessed using a common programming interface.

The typical implementation for handling iSCSI traffic where CPU 114 executes almost all the software layers is slow and hence undesirable. One solution has been to offload TCP/IP stack processing to the adapter. Such adapters use a TCP/IP Offload engine (TOE) to handle TCP/IP processing. These adapters are also configured to perform iSCSI layer processing. One shortcoming of the TOE solution is an expensive and complex adapter.

The present disclosure provides a hybrid solution, where the TCP/IP stack is still executed in software by the host system, but some of the iSCSI and/or DDP related processing is executed by the adapter 126. In one embodiment, an iSCSI/DDP accelerator module (may jointly be referred to as "accelerator") 208 is provided. Accelerator 208 interfaces with the storage driver 204 and with adapter firmware 216 stored at memory 144. Accelerator 208 interfaces with adapter 126 to perform certain iSCSI layer functionality both in the receive and transmit paths. The term "receive" in this context means information received by adapter 126 from network 128. The term transmit means information transmitted by adapter 126.

When an iSCSI PDU is received by adapter 126, it is moved up to host 112 via software path (i.e. driver 212, TCP/IP stack 210, iSCSI layer 206, storage driver 204 to application 202). While CPU 114 executes the TCP/IP stack, adapter 126 performs cyclic redundancy code (CRC) checks and notifies accelerator 208 if the CRC is valid.

When a PDU is sent by adapter 126, similar operations occur for CRC computation. The PDU takes the software path but using accelerator 208, CRC is computed by the adapter 126.

Accelerator 208 may also be used for performing certain DDP functions that are typically performed by CPU 114. In this case, adapter 126 performs iSCSI parsing, iSCSI CRC computation and DDP protocol related functions.

Figure 2B:
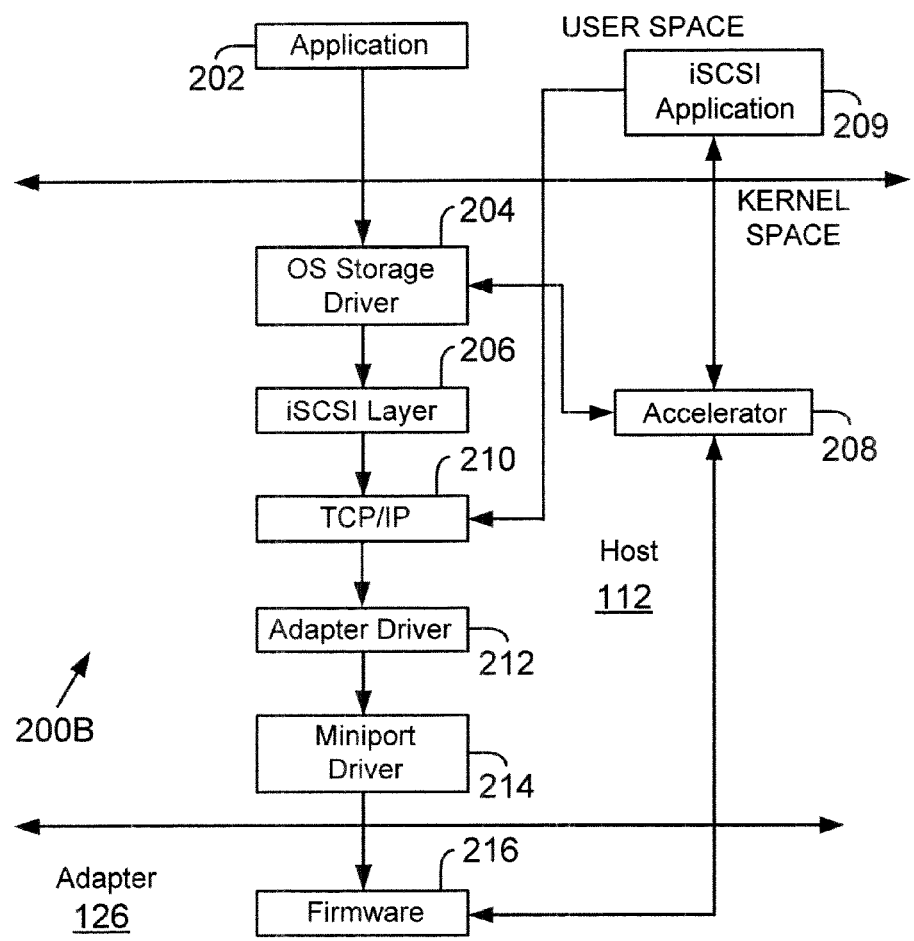

FIG. 2B shows another embodiment 200B of the present disclosure. In this embodiment, an iSCSI application 209 is provided that interfaces with accelerator 208. In this example, iSCSI application 209 interfaces with the TCP/IP stack 210 to send and receive network information. CRC computation is still performed by adapter 126, as described above with respect to FIG. 2A.

Figure 3:
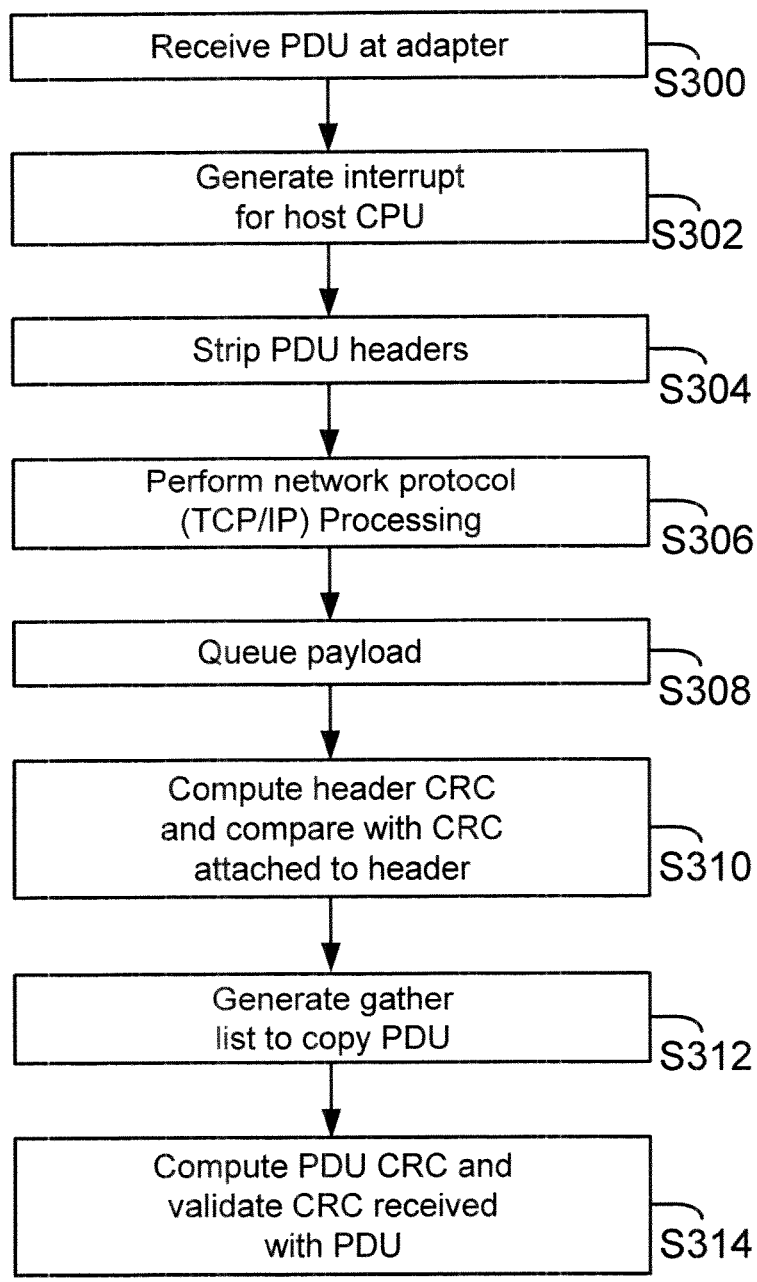
FIG. 3 shows a process flow diagram for processing received network information, according to one embodiment.

Process Flow:

Receive Path Processing:

FIG. 3 shows a process flow diagram for handling network information (may also be referred to as frames or packets; received by adapter 126 from network 128. The process begins in block S300, when a PDU is received by adapter 126. The adapter 126 stores the PDU in receive module 142 and in block S302, interrupts the CPU 114.

In block S304, driver 212 strips the Ethernet, TCP/IP headers, and in block S306, CPU 114 by executing TCP/IP stack 210 performs TCP/IP processing on the received PDU. In block S308, the PDU is queued for further processing.

In block S310, adapter 126 interfacing with accelerator 208 computes CRC over an iSCSI header. The header typically includes 48 bytes, a header CRC and in some cases additional header bytes. Adapter 126 computes the CRC over the iSCSI header and compares it with the CRC attached to the header. If the CRC is valid, adapter 126 indicates that to accelerator 208 so that further processing can be completed.

In block S312, accelerator 126 creates a gather list indicating a location where the data payload should be copied, i.e., to a buffer assigned to an application buffer (not shown) or to memory 116.

In block S314, CRC is computed on the data payload for the PDU. Adapter 126 computes the CRC and notifies the accelerator 208, if the CRC is valid or invalid.

Figure 4:
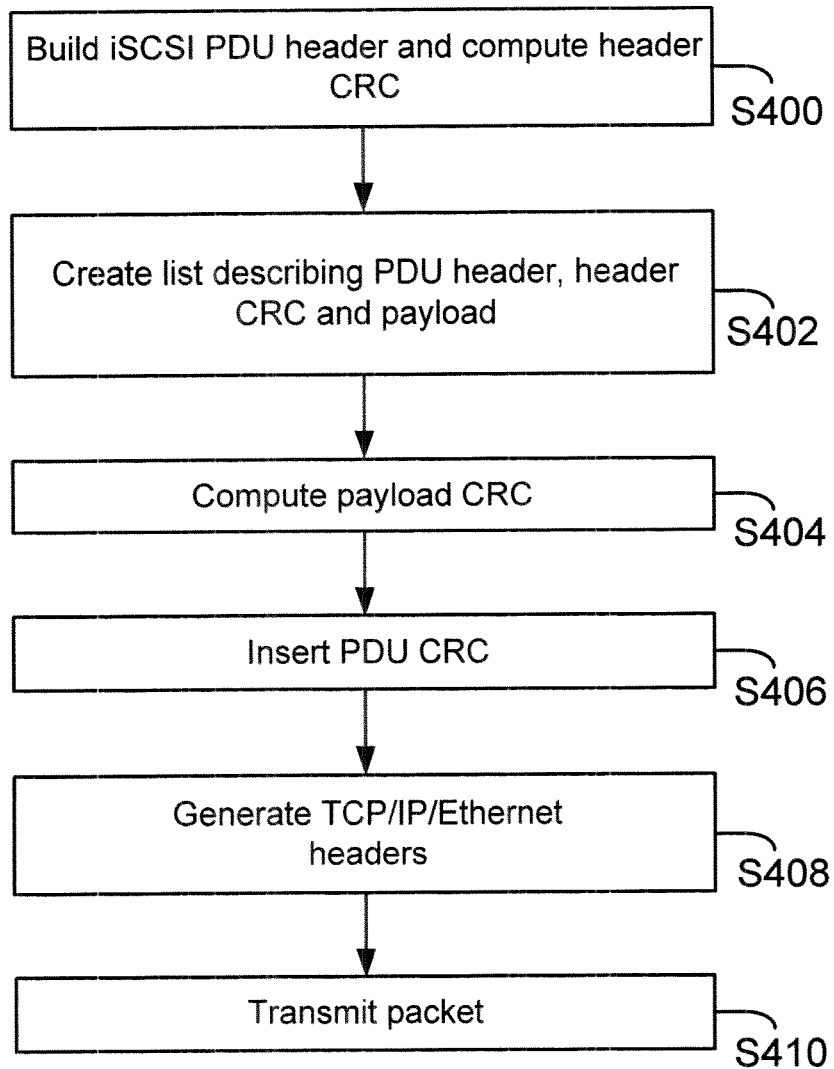
FIG. 4 shows a process flow diagram for transmitting network information, according to one embodiment.

Transmit Path Processing:

FIG. 4 shows a process flow diagram for processing an iSCSI PDU in a transmit path, according to one embodiment. The process begins in block S400, when iSCSI layer 206 (or accelerator 208) builds an iSCSI PDU header describing the PDU and computes the CRC for the header. The computed CRC is attached to the iSCSI header In block S402, the iSCSI layer 206 creates a gather list that describes the header, the header CRC and the iSCSI payload.

In block S404, the PDU without the PDU CRC is sent to adapter 126 that computes the CRC for the iSCSI payload. In block S406, accelerator 208 inserts the CRC in the iSCSi CRC. Thereafter, in block S408, TCP/IP/Ethernet headers are generated and in block S410, the packet is sent by adapter 126.

In one embodiment, instead of using an adapter with a TCP/IP offload engine that performs all TCP/IP processing, a software implementation of the TCP/IP stack is maintained. The accelerator module is provided to boost network information processing by having the adapter perform selective functions (for example, CRC computation). In this solution one does not have to use an expensive adapter for efficiently processing network information.

Although the present disclosure has been described with reference to specific embodiments, these embodiments are illustrative only and not limiting. Many other applications and embodiments of the present invention will be apparent in light of this disclosure and the following claims. References throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics being referred to may be combined as suitable in one or more embodiments of the invention, as will be recognized by those of ordinary skill in the art.

What is claimed is:

1. A system for processing network information, comprising:
   a computing system operationally coupled to a network device for transmitting and receiving network information, the computing system having a memory and a processor for executing instructions for:
   an application module executed out of the memory that generates an input/output ("I/O") request for transmitting and receiving network information to and from the network device;
   a storage driver executed out of the memory for receiving the I/O request from the application module;
   a network protocol stack executed out of the memory for executing a network protocol layer for processing network related information; and
   an accelerator module executed out of the memory that interfaces with the storage driver and the network protocol stack for accelerating processing of Internet Small Computer System Interface (iSCSI) protocol data units (PDUs); and
   an adapter without a TCP/IP offload engine operationally coupled to the computing system and configured to assist the accelerator module for performing certain functions for processing the iSCSI PDUs that are received and transmitted by the adapter;
   wherein when an iSCSI PDU is received by the adapter, then the adapter forwards the iSCSI PDU to an adapter driver that is executed by the processor and strips network headers from the received iSCSI PDU, the network protocol stack executed by the processor performs network protocol processing, and simultaneously the adapter determines cyclic redundancy code (CRC) for a header of the iSCSI PDU, uses the determined CRC to verify if CRC associated with the header of the received iSCSI PDU is valid, determines a CRC for a payload of the received iSCSI PDU and notifies the accelerator module when the CRC associated with the header of the received PDU is valid or invalid for further processing the received iSCSI PDU; and
   wherein when an iSCSI PDU is transmitted by the adapter, then the accelerator module: builds an iSCSI header, computes CRC for the header, attaches the computed CRC to the iSCSI header and sends the iSCSI PDU to the adapter that only computes CRC for a payload of the iSCSI PDU, before transmitting the iSCSI PDU.

2. The system of claim 1, wherein the accelerator module performs direct data placement (DDP) related processing for placing the received iSCSI PDU to an assigned location in a computing system memory.

3. The system of claim 1, wherein the processor also executes instructions for an iSCSI application that interfaces with the accelerator module and the network protocol stack for processing the iSCSI PDUs.

4. The system of claim 1, wherein the network protocol stack is a transmission control protocol/Internet Protocol (TCP/IP) stack.

5. The system of claim 1, wherein the adapter notifies the accelerator module after verifying if the CRC associated with the header of the received iSCSI PDU is valid.

6. The system of claim 1, wherein the adapter notifies the accelerator module if the CRC for the payload of the received iSCSI PDU is valid.

7. The system of claim 1, wherein the adapter is operationally coupled to the computing system via a PCI-Express connection.

8. The system of claim 1, wherein adapter processor executing firmware code interfaces with the accelerator module.

9. A system for processing network information, comprising:
  a computing system operationally coupled to a network device, the computing system having a memory and a processor for executing instructions for:
  an application module executed out of the memory that generates an input/output ("I/O") request for receiving network information from a network device;
  a storage driver executed out of the memory for receiving the I/O request from the application module;
  a network protocol stack executed out of the memory for executing a network protocol layer for processing network related information; and
  an accelerator module executed out of the memory that interfaces with the storage driver and the network protocol stack for accelerating processing of a received Internet Small Computer System Interface (iSCSI) protocol data unit (PDU); and
  an adapter without a TCP/IP offload engine operationally coupled to the computing system and configured to assist the accelerator module for performing certain functions for processing the iSCSI PDU received by the adapter;
  wherein the adapter forwards the iSCSI PDU to an adapter driver executed by the processor, which strips network headers from the received iSCSI PDU, the network protocol stack executed by the processor performs network protocol processing and simultaneously the adapter determines cyclic redundancy code (CRC) for a header of the iSCSI PDU, uses the determined CRC to verify if CRC associated with the iSCSI PDU is valid, notifies the accelerator module after verifying if the CRC associated with the header of the received iSCSI PDU is valid and determines a CRC for a payload of the iSCSI PDU and then notifies the accelerator module if the CRC for the payload of the received iSCSI PDU is valid or invalid for further processing the received iSCSI PDU.

10. The system of claim 9, wherein the accelerator module performs direct data placement (DDP) related processing for placing the received iSCSI PDU to an assigned location in a computing system memory.

11. The system of claim 9, wherein the processor executes instructions for an iSCSI application that interfaces with the accelerator module and the network protocol stack for processing the iSCSI PDUs.

12. The system of claim 9, wherein the network protocol stack is a transmission control protocol/Internet Protocol (TCP/IP) stack.

13. The system of claim 9, wherein the adapter is operationally coupled to the computing system via a PCI-Express connection.

14. The system of claim 9, wherein adapter processor executing firmware code interfaces with the accelerator module.

15. A system for processing network information, comprising:
  a computing system operationally coupled to a network device, the computing system having a memory and a processor for executing instructions for:
  an application module executed out of the memory that generates an input/output ("I/O") request for transmitting network information to a network device;
  a storage driver executed out of the memory for receiving the I/O request from the application module;
  a network protocol stack executed out of the memory for executing a network protocol layer for processing network related information; and
  an accelerator module executed out of the memory that interfaces with the storage driver and the network protocol stack for accelerating processing of an Internet Small Computer System Interface (iSCSI) protocol data unit (PDU); and
  an adapter without a TCP/IP offload engine operationally coupled to the computing system and configured to assist the accelerator module for performing certain functions for processing the iSCSI PDU that transmitted by the adapter;
  wherein when the iSCSI PDU is received by the adapter, then the adapter forwards the iSCSI PDU to an adapter driver that is executed by the processor and strips network headers from the received iSCSI PDU, the network protocol stack executed by the processor performs network protocol processing, and simultaneously the adapter determines cyclic redundancy code (CRC) for a header of the iSCSI PDU, uses the determined CRC to verify if CRC associated with the header of the received iSCSI PDU is valid, determines a CRC for a payload of the received iSCSI PDU and notifies the accelerator module when the CRC associated with the header of the received PDU is valid or invalid for further processing the received iSCSI PDU; and
  wherein the accelerator module: builds an iSCSI header for the iSCSI PDU, computes CRC for the iSCSI header, attaches the computed CRC to the iSCSI header and sends the iSCSI PDU to the adapter before transmitting the iSCSI PDU.

16. The system of claim 15, wherein the processor executes instructions for an iSCSI application that interfaces with the accelerator module and the network protocol stack for processing the iSCSI PDU.

17. The system of claim 15, wherein the network protocol stack is a transmission control protocol/Internet Protocol (TCP/IP) stack.

18. The system of claim 15, wherein the adapter is operationally coupled to the computing system via a PCI-Express connection.

19. The system of claim 15, wherein adapter processor executing firmware code interfaces with the accelerator module.

* * * * *

UNITED STATES PATENT AND TRADEMARK OFFICE
CERTIFICATE OF CORRECTION

PATENT NO. : 8,793,399 B1  
APPLICATION NO. : 12/536336  
DATED : July 29, 2014  
INVENTOR(S) : Rajagopal et al.

Page 1 of 1

It is certified that error appears in the above-identified patent and that said Letters Patent is hereby corrected as shown below:

On the title page, above Item [74] "Primary Examiner", line 1, delete "Brain" and insert -- Brian --, therefor.

In the Specification

Column 1, line 8, delete "parent" and insert -- Patent --, therefor.

Column 4, line 27, delete "request," and insert -- request. --, therefor.

Column 7, line 4, delete "packets;" and insert -- packets) --, therefor.

Signed and Sealed this  
Twenty-fifth Day of November, 2014

Michelle K. Lee  
*Deputy Director of the United States Patent and Trademark Office*